United States Patent

Ku

(10) Patent No.: US 8,456,937 B2
(45) Date of Patent: Jun. 4, 2013

(54) SEMICONDUCTOR INTEGRATED CIRCUIT

(75) Inventor: Kie Bong Ku, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 120 days.

(21) Appl. No.: 13/189,924

(22) Filed: Jul. 25, 2011

(65) Prior Publication Data

US 2012/0155205 A1   Jun. 21, 2012

(30) Foreign Application Priority Data

Dec. 21, 2010   (KR) .................. 10-2010-0131994

(51) Int. Cl.
*G11C 7/00*   (2006.01)

(52) U.S. Cl.
USPC ............. 365/222; 365/233.1; 365/189.05

(58) Field of Classification Search
USPC ............. 365/222, 233.1, 189.05, 233.11
See application file for complete search history.

(56) References Cited

U.S. PATENT DOCUMENTS 7,106,646 B2 * 9/2006 Schoenfeld et al. .......... 365/222

FOREIGN PATENT DOCUMENTS

| KR | 1020050036881 A | 4/2005 |
| KR | 1020060072984 A | 6/2006 |
| KR | 1020060135227 A | 12/2006 |

* cited by examiner

*Primary Examiner* — David Lam
(74) *Attorney, Agent, or Firm* — William Park & Associates Patent Ltd.

(57) ABSTRACT

A semiconductor memory apparatus includes a buffer control unit configured to deactivate a buffer control signal in response to an auto-refresh start pulse, and activate the buffer control signal in response to an auto-refresh end pulse, a command buffer configured to buffer an external command and output an internal command when the buffer control signal is activated, an address buffer configured to buffer an external address and output an internal address when the buffer control signal is activated, and a clock buffer configured to buffer an external clock and output an internal clock when the buffer control signal is activated.

14 Claims, 3 Drawing Sheets

SEMICONDUCTOR INTEGRATED CIRCUIT

CROSS-REFERENCE TO RELATED APPLICATION

The present application claims priority under 35 U.S.C. §119(a) to Korean Patent Application No. 10-2010-0131994, filed on Dec. 21, 2010, in the Korean Intellectual Property Office, which is incorporated herein by reference in its entirety as if set forth in full.

BACKGROUND

1. Technical Field

Various embodiments of the present invention generally relate to semiconductor integrated circuits. In particular, certain embodiments relate to a semiconductor memory apparatus.

2. Related Art

A semiconductor memory apparatus typically includes a plurality of data storage memory cells to store data from external input and output stored data therefrom. A memory cell may consist of a capacitor and a transistor which stores data by charging or discharging charge in/from the capacitor.

A semiconductor memory apparatus which stores data in this way performs refresh operations regularly to substantially maintain the amount of charge in the capacitor.

Since the semiconductor memory apparatus stores data and outputs stored data, the highest priority operation is substantially maintaining the stored data. Such a refresh operation has the highest priority in the semiconductor memory apparatus.

The refresh operations may be classified into auto-refresh operations and self-refresh operations. The auto-refresh operation is performed by an external controller for controlling the semiconductor memory apparatus, and the self-refresh operation is performed when the external controller does not output a command for a predetermined time.

Thus, while the semiconductor memory apparatus is performing the auto-refresh operation by the external controller, the external controller outputs neither a command nor an address to the semiconductor memory apparatus. However, a typical semiconductor memory apparatus operates circuits for receiving commands and addresses output from the external controller during the auto-refresh operation, resulting in an increase in current consumption.

SUMMARY

Accordingly, there is a need for an improved semiconductor memory apparatus which is capable of reducing the current consumption.

To attain the advantages and in accordance with the purposes of the invention, as embodied and broadly described herein, one exemplary aspect of the present invention may provide a semiconductor memory apparatus which comprises: a buffer control unit configured to deactivate a buffer control signal in response to an auto-refresh start pulse, and activate the buffer control signal in response to an auto-refresh end pulse; a command buffer configured to buffer an external command and output an internal command when the buffer control signal is activated; an address buffer configured to buffer an external address and output an internal address when the buffer control signal is activated; and a clock buffer configured to buffer an external clock and output an internal clock when the buffer control signal is activated.

In another exemplary aspect of the present invention, a semiconductor memory apparatus may include: a plurality of buffers configured to buffer an external command, an external address, and an external clock to generate an internal command, an internal address, and an internal clock when a buffer control signal is activated; a plurality of latch units configured to latch the internal command and the internal address in synchronization with the internal clock; a decoder configured to decode output of the plurality of latch units and generate an auto-refresh activation signal; an auto-refresh signal generation unit configured to generate an auto-refresh start pulse and an auto-refresh end pulse in response to the auto-refresh activation signal; and a buffer control unit configured to generate the buffer control signal in response to the auto-refresh start pulse, the auto-refresh end pulse, and a clock enable signal.

In another exemplary aspect of the present invention, a semiconductor memory apparatus may include: a buffer control unit configured to deactivate a buffer control signal when an auto-refresh operation starts, activate the buffer control signal when a predetermined time lapses, deactivate the buffer control signal when a clock enable signal is deactivated and a self-refresh operation starts, and activate the buffer control signal when the clock enable signal is activated and the self-refresh operation ends; and a plurality of buffers configured to be activated in response to the buffer control signal and buffer a command, an address, and a clock which are provided from an outside of the semiconductor memory apparatus.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
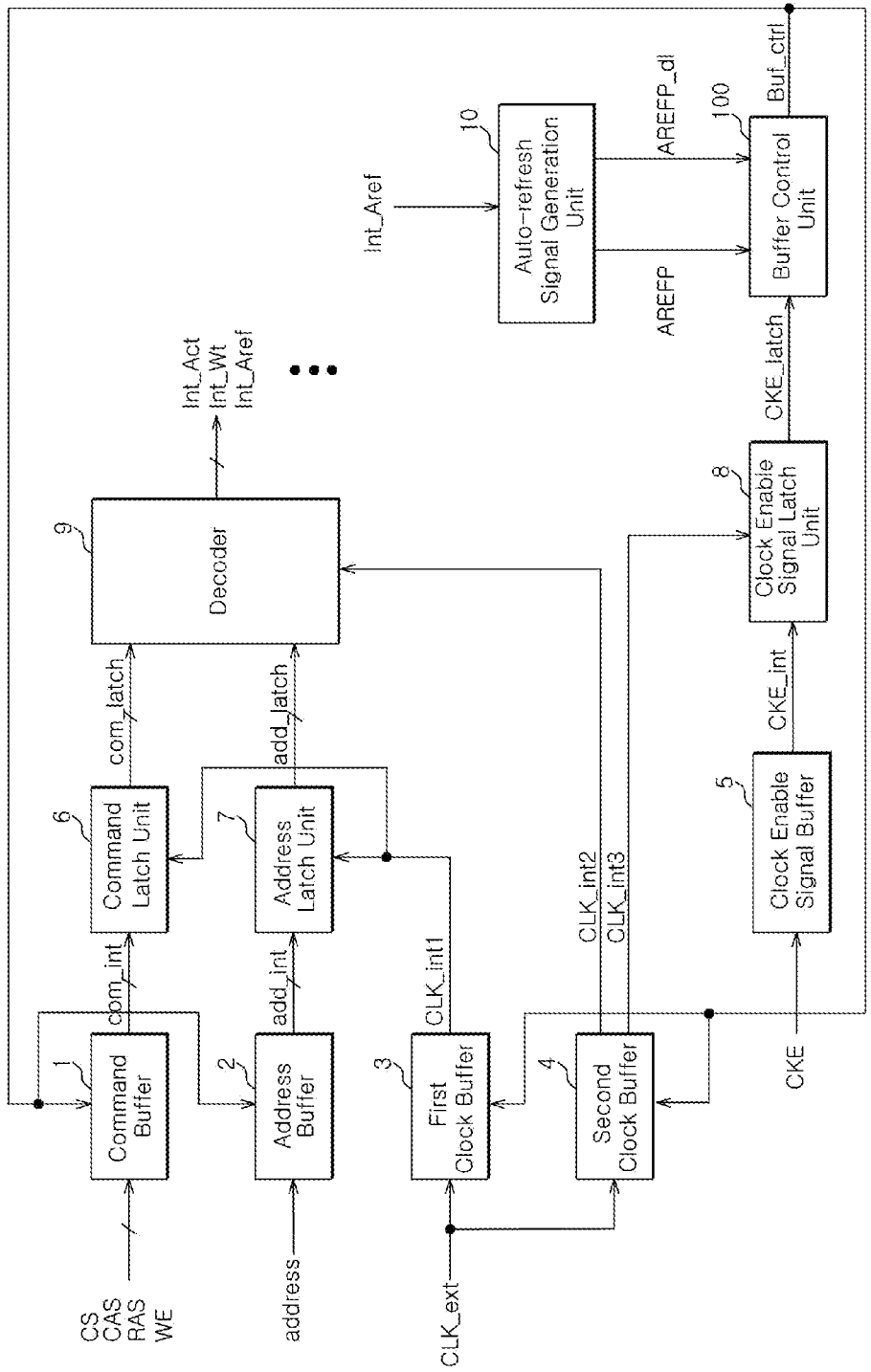
FIG. 1 is a configuration diagram schematically illustrating a semiconductor memory apparatus according to an exemplary embodiment.

Reference will now be made in detail to the exemplary embodiments consistent with the present disclosure, examples of which are illustrated in the accompanying drawings. Wherever possible, the same reference characters will be used throughout the drawings to refer to the same or like parts.

Referring to FIG. 1, a semiconductor memory apparatus according to an embodiment may include a command buffer 1, an address buffer 2, a first clock buffer 3, a second clock buffer 4, a clock enable signal buffer 5, a command latch unit 6, an address latch unit 7, a clock enable signal latch unit 8, a decoder 9, an auto-refresh signal generation unit 10, and a buffer control unit 100.

The command buffer 1 is configured to be activated in response to a buffer control signal Buf_ctrl. The command buffer 1 is activated to buffer external commands provided from outside of the semiconductor memory apparatus and output an internal command com_int. The external commands may include a chip selection signal CS, a column address strobe signal CAS, a row address strobe signal RAS, and a write enable signal WE.

The address buffer 2 is configured to be activated in response to the buffer control signal Buf_ctrl. The address buffer 2 is activated to buffer an external address provided from outside of the semiconductor memory apparatus and output an internal address add_int.

The first clock buffer 3 is configured to be activated in response to the buffer control signal Buf_ctrl. The first clock buffer 3 is activated to buffer an external clock CLK_ext provided from outside of the semiconductor memory apparatus and output a first internal clock CLK_int1. Meanwhile, the first clock buffer 3 is deactivated to lock the first internal clock CLK_int1 to a specific level.

The second clock buffer 4 is configured to buffer the external clock CLK_ext and output a second internal clock CLK_int2 when the buffer control signal Buf_ctrl is activated, and to lock the second internal clock CLK_int2 to a specific level when the buffer control signal Buf_ctrl is deactivated. Furthermore, the second clock buffer 4 is configured to buffer the external clock CLK_ext regardless of the buffer control signal Buf_ctrl and output a third internal clock CLK_int3.

The clock enable signal buffer 5 is configured to buffer a clock enable signal CKE provided from outside of the semiconductor memory apparatus and output an internal clock enable signal CKE_int.

The command latch unit 6 is configured to latch the internal command com_int in synchronization with the first internal clock CLK_int1 and output the latched internal command com_int as a latch command com_latch. More specifically, when the external clock CLK_ext is output as the first internal clock CLK_int1, the command latch unit 6 is activated to latch the internal command com_int in synchronization with the first internal clock CLK_int1. Meanwhile, when the first internal clock CLK_int1 is locked to a specific level, the command latch unit 6 is deactivated to substantially maintain only a signal latched regardless of the internal command com_int.

The address latch unit 7 is configured to latch the internal address add_int in synchronization with the first internal clock CLK_int1 and output the latched internal address add_int as a latch address add_latch. More specifically, when the external clock is output as the first internal clock CLK_int1, the address latch unit 7 is activated to latch the internal address add_int in synchronization with the first internal clock CLK_int1. Meanwhile, when the first internal clock CLK_int1 is locked to a specific level, the address latch unit 7 is deactivated to substantially maintain only a signal latched regardless of the internal address add_int.

The clock enable signal latch unit 8 is configured to latch the internal clock enable signal CKE_int in synchronization with the third internal clock CLK_int3 and output the latched internal clock enable signal CKE_int as a latch clock enable signal CKE_latch.

The decoder 9 is configured to be activated when the external clock CLK_ext is output as the second internal clock CLK_int2, and decode the latch command com_latch and the latch address add_latch to activate internal operation command signals and the like. The internal operation command signals may include an internal active signal Int_Act, an internal write signal Int_Wt, an auto-refresh activation signal Int_Aref, and the like.

The auto-refresh signal generation unit 10 is configured to generate an auto-refresh start pulse AREFP and an auto-refresh end pulse AREFP_dl when the auto-refresh activation signal Int_Aref is activated by the decoder 9. For example, when the auto-refresh activation signal Int_Aref is activated, the auto-refresh signal generation unit 10 generates the auto-refresh start pulse AREFP. After a predetermined time lapses, the auto-refresh signal generation unit 10 generates the auto-refresh end pulse AREFP_dl.

The buffer control unit 100 is configured to generate the buffer control signal Buf_ctrl in response to the auto-refresh start pulse AREFP, the auto-refresh end pulse AREFP_dl, and the latch clock enable signal CKE_latch. For example, when the auto-refresh start pulse AREFP is input, the buffer control unit 100 deactivates the buffer control signal Buf_ctrl. When the auto-refresh end pulse AREFP_dl is input, the buffer control unit 100 activates the buffer control signal Buf_ctrl. Furthermore, when the latch clock enable signal CKE_latch is activated, the buffer control unit 100 activates the buffer control signal Buf_ctrl. When the latch clock enable signal CKE_latch is deactivated, the buffer control unit 100 deactivates the buffer control signal Buf_ctrl.

Figure 2:
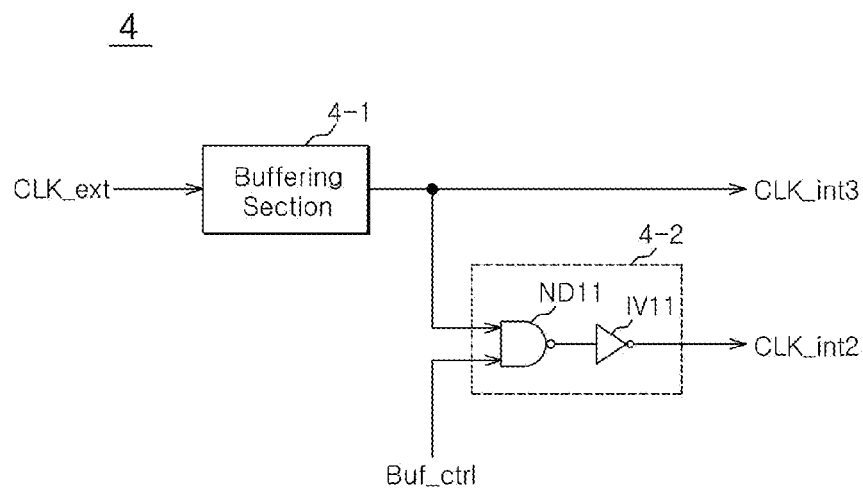
FIG. 2 is a configuration diagram of the second clock buffer illustrated in FIG. 1.

The address buffer 2 may include a buffering section 4-1 and an output control section 4-2 as illustrated in FIG. 2.

The buffering section 4-1 is configured to buffer the external clock CLK_ext and output the third internal clock CLK_int3.

The output control section 4-2 is configured to output the third internal clock CLK_int3 as the second internal clock CLK_int2 when the buffer control signal Buf_ctrl is activated, and lock the second internal clock CLK_int2 to a specific level (that is, a low level) when the buffer control signal Buf_ctrl is deactivated.

The output control section 4-2 includes a first NAND gate ND11 and a first inverter IV11. The first NAND gate ND11 is configured to receive the third internal clock CLK_int3 and the buffer control signal Buf_ctrl. The first inverter IV11 is configured to receive an output signal of the first NAND gate ND11 and output the second internal clock CLK_int2.

Figure 3:
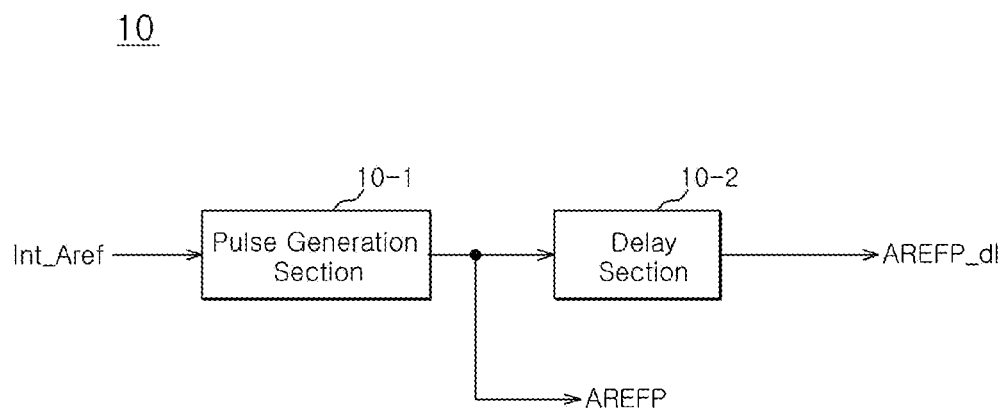
FIG. 3 is a configuration diagram of the auto-refresh signal generation unit illustrated in FIG. 1.

The auto-refresh signal generation unit 10 includes a pulse generation section 10-1 and a delay section 10-2 as illustrated in FIG. 3.

The pulse generation section 10-1 is configured to generate the auto-refresh start pulse AREFP activated for a predetermined time when the auto-refresh activation signal Int_Aref is activated.

The delay section 10-2 is configured to generate the auto-refresh end pulse AREFP_dl by delaying the auto-refresh start pulse AREFP.

Figure 4:
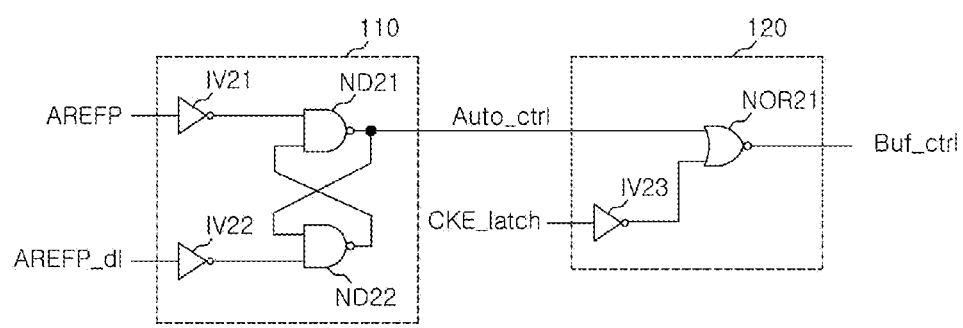
FIG. 4 is a configuration diagram of the buffer control unit illustrated in FIG. 1.

The buffer control unit 100 may include an auto-control signal activation maintaining section 110 and a buffer control signal generation section 120 as illustrated in FIG. 4.

The auto-control signal activation maintaining section 110 is configured to activate an auto-control signal Auto-ctrl until the auto-refresh end pulse AREFP_dl is input when the auto-refresh start pulse AREFP is input. That is, the auto-control signal activation maintaining section 110 activates the auto-control signal Auto-ctrl when the auto-refresh start pulse AREFP is input, and deactivates the auto-control signal Auto-ctrl when the auto-refresh end pulse AREFP_dl is input.

The auto-control signal activation maintaining section 110 includes second and third inverters IV21 and IV22, and second and third NAND gates ND21 and ND22. The second inverter IV21 is configured to receive the auto-refresh start pulse AREFP. The third inverter IV22 is configured to receive the auto-refresh end pulse AREFP_dl. The second NAND gate ND21 is configured to receive an output signal of the second inverter IV21 and an output signal of the third NAND gate ND22. The third NAND gate ND22 is configured to receive an output signal of the third inverter IV22 and an output signal of the second NAND gate ND21.

The buffer control signal generation section 120 is configured to deactivate the buffer control signal Buf_ctrl when the auto-control signal Auto-ctrl is activated, and activate the buffer control signal Buf_ctrl when the auto-control signal Auto-ctrl is deactivated. Furthermore, the buffer control signal generation section 120 is configured to activate the buffer control signal Buf_ctrl when the latch clock enable signal CKE_latch is activated, and deactivate the buffer control signal Buf_ctrl when the latch clock enable signal CKE_latch is deactivated.

The buffer control signal generation section 120 includes a third inverter IV23 and a NOR gate NOR21. The third inverter IV23 is configured to receive the latch clock enable signal CKE_latch. The NOR gate NOR21 is configured to receive the auto-control signal Auto-ctrl and an output signal of the third inverter IV23 and output the buffer control signal Buf_ctrl.

The operation of the semiconductor memory apparatus configured as above according to the embodiment will be described below.

When the semiconductor memory apparatus does not perform self-refresh operation or auto-refresh operation, the clock enable signal CKE is activated to a high level, and the auto-refresh start pulse AREFP and the auto-refresh end pulse AREFP_dl are at a low level. Thus, the buffer control signal Buf_ctrl is activated to a high level.

The buffer control signal Buf_ctrl is activated to a high level, so that the command buffer 1, the address buffer 2, the first clock buffer 3, and the second clock buffer 4 illustrated in FIG. 1 are activated. Also, the command latch unit 6, the address latch unit 7, and the decoder 9, which receive the output of the activated first and second clock buffers 3 and 4, are activated.

The activated command buffer 1 buffers the external commands CS, CAS, RAS and WE and outputs the internal command com_int.

The activated address buffer 2 buffers the external address and outputs the internal address add_int.

The activated first clock buffer 3 buffers the external clock CLK_ext and outputs the first internal clock CLK_int1.

The second clock buffer 4 buffers the external clock CLK_ext and outputs the second and third internal clocks CLK_int2 and CLK_int3. The third internal clock CLK_int3 is output as a signal, which periodically changes, regardless of the buffer control signal Buf_ctrl. Meanwhile, the second internal clock CLK_int2 is output as a signal, which periodically changes when the buffer control signal Buf_ctrl is activated, and is locked to a specific level when the buffer control signal Buf_ctrl is deactivated.

The clock enable signal buffer 5 buffers the clock enable signal CKE provided from outside of the semiconductor memory apparatus, regardless of the buffer control signal Buf_ctrl, and output the internal clock enable signal CKE_int.

The command latch unit 6 is activated by receiving the output of the activated first clock buffer 3; i.e., the first internal clock CLK_int1. The activated command latch unit 6 latches the internal command com_int in synchronization with the first internal clock CLK_int1. Furthermore, the command latch unit 6 outputs the latched signal as the latch command com_latch.

The address latch unit 7 is activated by receiving the output of the activated first clock buffer 3; i.e., the first internal clock CLK_int1. The activated address latch unit 7 latches the internal address add_int in synchronization with the first internal clock CLK_int1. Furthermore, the address latch unit 7 outputs the latched signal as the latch address add_latch.

The clock enable signal latch unit 8 latches the internal clock enable signal CKE_int in synchronization with the third internal clock CLK_int3. Furthermore, the clock enable signal latch unit 8 outputs the latched signal as the latch clock enable signal CKE_latch.

The decoder 9 is activated by receiving the output of the activated second clock buffer 4; i.e., the second internal clock CLK_int2. The activated decoder 9 decodes the latch command com_latch and the latch address add_latch to generate the internal operation command signals Int_Act, Int_Wt, Int_Aref and the like.

According to the embodiment as described above, when the self-refresh operation and the auto-refresh operation are not performed, internal operation command signals, such as Int_Act, Int_Wt, and Int_Aref, are generated in response to the external commands CS, CAS, RAS and WE, the external address, the external clock CLK_ext, and the clock enable signal CKE.

Next, a command giving instructions for the performance of the auto-refresh operation is input from outside of the semiconductor memory apparatus.

The command giving instructions for the performance of the auto-refresh operation is input to the decoder 9 through the command buffer 1, the address buffer 2, the command latch unit 6, and the address latch unit 7. The decoder 9 activates the auto-refresh activation signal Int_Aref of the internal operation command signals, such as Int_Act, Int_Wt, and Int_Aref.

The auto-refresh signal generation unit 10 generates the auto-refresh start pulse AREFP when the auto-refresh activation signal Int_Aref is activated, and generates the auto-refresh end pulse AREFP_dl after a predetermined time lapses.

The buffer control unit 100 deactivates the buffer control signal Buf_ctrl when the auto-refresh start pulse AREFP is input, and activates the buffer control signal Buf_ctrl when the auto-refresh end pulse AREFP_dl is input. That is, the buffer control signal Buf_ctrl is deactivated for a predetermined time when the command giving instructions for the performance of the auto-refresh operation is input from outside of the semiconductor memory apparatus.

When the buffer control signal Buf_ctrl is deactivated, the command buffer 1, the address buffer 2, the first clock buffer 3, and the second clock buffer 4 are deactivated, and the first and second internal clocks CLK_int1 and CLK_int2 are locked to a specific level. Thus, the command latch unit 6, the address latch unit 7, and the decoder 9 are deactivated.

When the buffer control signal Buf_ctrl is activated after being deactivated, the command buffer 1, the address buffer 2, the first clock buffer 3, the second clock buffer 4, the command latch unit 6, the address latch unit 7, and the decoder 9, which have been deactivated, are activated.

According to the embodiment, when the semiconductor memory apparatus performs the auto-refresh operation in response to an external command (an auto-refresh command), the command buffer 1, the address buffer 2, the command latch unit 6, the address latch unit 7, the clock buffers 3 and 4, and the decoder 9 are deactivated. Since no external commands and addresses are input from outside in the auto-refresh operation, the circuits (the command buffer 1, the address buffer 2, the command latch unit 6, the address latch unit 7, the clock buffers 3 and 4, and the decoder 9) related to external commands and addresses may be deactivated in the semiconductor memory apparatus. Consequently, according to the embodiment, it is possible to reduce electric current consumed in the semiconductor memory apparatus in the auto-refresh operation, as compared with the conventional art.

It is assumed that the buffer control signal Buf_ctrl is activated and thus the command buffer 1, the address buffer 2, the command latch unit 6, the address latch unit 7, the clock buffers 3 and 4, and the decoder 9 are activated and operate normally.

Next, when the clock enable signal CKE is deactivated from a high level to a low level, the buffer control signal Buf_ctrl is deactivated to a low level.

The buffer control signal Buf_ctrl is deactivated to the low level, so that the command buffer 1, the address buffer 2, the command latch unit 6, the address latch unit 7, the clock buffers 3 and 4, and the decoder 9 are deactivated. Then, when the clock enable signal CKE is activated to a high level, the buffer control signal Buf_ctrl is activated, so that the deactivated command buffer 1, address buffer 2, command latch unit 6, address latch unit 7, clock buffers 3 and 4, and decoder 9 are activated.

When the clock enable signal CKE is deactivated to a low level, the semiconductor memory apparatus performs the self-refresh operation. Then, when the clock enable signal CKE is activated to a high level, the semiconductor memory apparatus ends the self-refresh operation. Furthermore, a controller for controlling the semiconductor memory apparatus in the self-refresh operation substantially prevents external commands and addresses from being input to the semiconductor memory apparatus. In this regard, in the self-refresh operation, the circuits (the command buffer 1, the address buffer 2, the command latch unit 6, the address latch unit 7, the clock buffers 3 and 4, and the decoder 9) related to the external commands and addresses may be deactivated.

Consequently, according to the embodiment, in the self-refresh operation, the circuits (the command buffer 1, the address buffer 2, the command latch unit 6, the address latch unit 7, the clock buffers 3 and 4, and the decoder 9) related to the external commands and addresses are deactivated, so that current consumption is reduced.

As a consequence, according to the embodiment, in the auto-refresh operation and the self-refresh operation, the circuits (the command buffer 1, the address buffer 2, the command latch unit 6, the address latch unit 7, the clock buffers 3 and 4, and the decoder 9) related to the external commands and addresses are deactivated, so that it is possible to reduce current consumption. Furthermore, according to the embodiment, the circuits deactivated in the auto-refresh operation are activated after a predetermined time (the delay time of the delay section 10-2 illustrated in FIG. 3) lapses; i.e., the auto-refresh operation ends. In the self-refresh operation, the deactivated circuits are activated only when the clock enable signal CKE is activated to a high level.

According to the embodiment, when the auto-refresh operation is performed according to external commands, the circuits (the command buffer 1, the address buffer 2, the command latch unit 6, the address latch unit 7, the clock buffers 3 and 4, and the decoder 9) related to the external commands and addresses are activated after being deactivated for a predetermined time. Furthermore, according to the embodiment, while the self-refresh operation is performed by a clock enable signal provided from outside of the semiconductor memory apparatus, the circuits (the command buffer 1, the address buffer 2, the command latch unit 6, the address latch unit 7, the clock buffers 3 and 4, and the decoder 9) related to the external commands and addresses are deactivated, and then the deactivated circuits (the command buffer 1, the address buffer 2, the command latch unit 6, the address latch unit 7, the clock buffers 3 and 4, and the decoder 9) related to the external commands and addresses are activated again by a clock enable signal provided from outside, differently from the auto-refresh operation.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
    a buffer control unit configured to deactivate a buffer control signal in response to an auto-refresh start pulse, and activate the buffer control signal in response to an auto-refresh end pulse;
    a command buffer configured to buffer an external command and output an internal command when the buffer control signal is activated;
    an address buffer configured to buffer an external address and output an internal address when the buffer control signal is activated; and
    a clock buffer configured to buffer an external clock and output an internal clock when the buffer control signal is activated.

2. The semiconductor memory apparatus according to claim 1, further comprising:
    an auto-refresh signal generation unit configured to generate the auto-refresh start pulse when the external command is an auto-refresh command, and generate the auto-refresh end pulse when a predetermined time lapses after the auto-refresh start pulse is generated.

3. The semiconductor memory apparatus according to claim 1, wherein the buffer control unit is configured to deactivate the buffer control signal when the clock enable signal is deactivated or the auto-refresh start pulse is input, and activate the buffer control signal when the auto-refresh end pulse is input or a clock enable signal is activated.

4. The semiconductor memory apparatus according to claim 3, wherein the buffer control unit comprises:
    an auto-control signal activation maintaining section configured to activate an auto-control signal until the auto-refresh end pulse is input when the auto-refresh start pulse is input; and
    a buffer control signal generation section configured to invert the auto-control signal to output the buffer control signal when the clock enable signal is activated, deactivate the buffer control signal when the clock enable signal is deactivated and activate the buffer control signal when the clock enable signal is activated in a case in which the auto-control signal is deactivated.

5. A semiconductor memory apparatus comprising:
a plurality of buffers configured to buffer an external command, an external address, and an external clock to generate an internal command, an internal address, and an internal clock when a buffer control signal is activated;
a plurality of latch units configured to latch the internal command and the internal address in synchronization with the internal clock;
a decoder configured to decode output of the plurality of latch units and generate an auto-refresh activation signal;
an auto-refresh signal generation unit configured to generate an auto-refresh start pulse and an auto-refresh end pulse in response to the auto-refresh activation signal; and
a buffer control unit configured to generate the buffer control signal in response to the auto-refresh start pulse, the auto-refresh end pulse, and a clock enable signal.

6. The semiconductor memory apparatus according to claim 5, wherein, among the plurality of buffers, a buffer for buffering the external clock to generate the internal clock configured to be deactivated in response to the buffer control signal and lock the internal clock to a specific level.

7. The semiconductor memory apparatus according to claim 6, wherein the plurality of latch units are configured to be activated when the external clock is output as the internal clock and latch the internal command and the internal address in synchronization with the internal clock, and to be deactivated when the internal clock is locked to the specific level and substantially maintain only a signal latched regardless of the internal command and the internal address.

8. The semiconductor memory apparatus according to claim 5, wherein the auto-refresh signal generation unit is configured to generate the auto-refresh start pulse when the auto-refresh activation signal is activated, and generate the auto-refresh end pulse when a predetermined time lapses.

9. The semiconductor memory apparatus according to claim 8, wherein the buffer control unit is configured to deactivate the buffer control signal when the clock enable signal is deactivated or the auto-refresh start pulse is input, and activate the buffer control signal when the auto-refresh end pulse is input or the clock enable signal is activated.

10. The semiconductor memory apparatus according to claim 9, wherein the buffer control unit comprises:
an auto-control signal activation maintaining section configured to activate an auto-control signal until the auto-refresh end pulse is input when the auto-refresh start pulse is input; and
an buffer control signal generation section configured to invert the auto-control signal to output the buffer control signal when the clock enable signal is activated, deactivate the buffer control signal when the clock enable signal is deactivated and activate the buffer control signal when the clock enable signal is activated in a case in which the auto-control signal is deactivated.

11. A semiconductor memory apparatus comprising:
a buffer control unit configured to deactivate a buffer control signal when an auto-refresh operation starts, activate the buffer control signal when a predetermined time lapses, deactivate the buffer control signal when a clock enable signal is deactivated and a self-refresh operation starts, and activate the buffer control signal when the clock enable signal is activated and the self-refresh operation ends; and
a plurality of buffers configured to be activated in response to the buffer control signal and buffer a command, an address, and a clock, which are provided from outside of the semiconductor memory apparatus.

12. The semiconductor memory apparatus according to claim 11, further comprising:
an auto-refresh signal generation unit configured to generate an auto-refresh start pulse when an auto-refresh command is input from outside of the semiconductor memory apparatus, and generate an auto-refresh end pulse when a predetermined time lapses after the auto-refresh start pulse is generated.

13. The semiconductor memory apparatus according to claim 12, wherein the buffer control unit is configured to deactivate the buffer control signal when the clock enable signal is deactivated or the auto-refresh start pulse is input, and activate the buffer control signal when the auto-refresh end pulse is input or the clock enable signal is activated.

14. The semiconductor memory apparatus according to claim 13, wherein the buffer control unit comprises:
an auto-control signal activation maintaining section configured to activate an auto-control signal until the auto-refresh end pulse is input when the auto-refresh start pulse is input; and
an buffer control signal generation section configured to invert the auto-control signal to output the buffer control signal when the clock enable signal is activated, deactivate the buffer control signal when the clock enable signal is deactivated and activate the buffer control signal when the clock enable signal is activated in a case in which the auto-control signal is deactivated.

* * * * *